United States Patent
Zinn

(10) Patent No.: US 8,004,039 B2
(45) Date of Patent: Aug. 23, 2011

(54) FIELD EFFECT TRANSISTOR WITH TRENCH-ISOLATED DRAIN

(75) Inventor: David R. Zinn, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 139 days.

(21) Appl. No.: 12/533,971

(22) Filed: Jul. 31, 2009

(65) Prior Publication Data

US 2011/0024836 A1 Feb. 3, 2011

(51) Int. Cl.
*H01L 29/66* (2006.01)
(52) U.S. Cl. .......... 257/339; 257/409; 257/E29.256; 438/296; 438/430
(58) Field of Classification Search ............ 257/339, 257/409, E29.256; 438/296, 430
See application file for complete search history.

(56) References Cited

U.S. PATENT DOCUMENTS

| | | | |
|---|---|---|---|
| 2002/0013029 A1* | 1/2002 | Hwang | 438/268 |
| 2004/0097019 A1* | 5/2004 | de Fresart et al. | 438/140 |
| 2008/0067615 A1* | 3/2008 | Kim | 257/408 |
| 2008/0315306 A1* | 12/2008 | Yoo et al. | 257/339 |
| 2009/0072310 A1* | 3/2009 | Koo et al. | 257/344 |

FOREIGN PATENT DOCUMENTS

EP 2058862 A1 * 5/2009

* cited by examiner

*Primary Examiner* — Steven J Fulk
(74) *Attorney, Agent, or Firm* — Patent Law Group LLP; Carmen C. Cook

(57) ABSTRACT

A MOS transistor includes a body region of a first conductivity type, a conductive gate and a first dielectric layer, a source region of a second conductivity type formed in the body region, a heavily doped source contact diffusion region formed in the source region, a lightly doped drain region of the second conductivity type formed in the body region where the lightly doped drain region is a drift region of the MOS transistor, a heavily doped drain contact diffusion region of the second conductivity type formed in the lightly doped drain region; and an insulating trench formed in the lightly doped drain region adjacent the drain contact diffusion region. The insulating trench blocks a surface current path in the drift region thereby forming vertical current paths in the drift region around the bottom surface of the trench.

10 Claims, 3 Drawing Sheets

FIELD EFFECT TRANSISTOR WITH TRENCH-ISOLATED DRAIN

FIELD OF THE INVENTION

The invention relates to field effect transistors and, in particular, to a transistor structure where the drain is isolated using trench technology.

DESCRIPTION OF THE RELATED ART

FIG. 1 is a cross-sectional view of a conventional metal-oxide-semiconductor (MOS) field effect transistor adapted for high-power applications. In the conventional NMOS transistor 10, the channel region under the gate terminal 22 is separated from the drain terminal 30 by a drift region 26. It is well known that by increasing the length of the drift region, the breakdown voltage of the MOS transistor can be increased accordingly. However, increasing the length of the drift region also increases size of the transistor device.

SUMMARY OF THE INVENTION

According to one embodiment of the present invention, a metal-oxide-semiconductor (MOS) transistor includes a body region of a first conductivity type formed in a semiconductor layer, a conductive gate insulated from the semiconductor layer by a first dielectric layer, a source region of a second conductivity type formed in the body region of the semiconductor layer on one side of the conductive gate where a part of the source region extends underneath the conductive gate, a heavily doped source contact diffusion region of the second conductivity type formed in the source region where the source contact diffusion region forms the source terminal of the MOS transistor, a lightly doped drain region of the second conductivity type formed in the body region of the semiconductor layer on the opposite side of the conductive gate where the lightly doped drain region is a drift region of the MOS transistor and a part of the lightly doped drain region extends underneath the conductive gate, a heavily doped drain contact diffusion region of the second conductivity type formed in the lightly doped drain region where the drain contact diffusion region forms the drain terminal of the MOS transistor; and an insulating trench formed in the lightly doped drain region adjacent the drain terminal. The insulating trench blocks a surface current path in the drift region thereby forming vertical current paths in the drift region around the bottom surface of the trench.

The present invention is better understood upon consideration of the detailed description below and the accompanying drawings.

DETAILED DESCRIPTION OF THE PREFERRED EMBODIMENTS

In accordance with the principles of the present invention, a metal-oxide-silicon (MOS) transistor includes an insulating trench formed in the drift region to create vertical current paths in the drift region. By creating an insulating trench between the drain terminal and the channel region of the transistor, the drain current must flow from the drain terminal by following vertical and horizontal pathways towards the induced channel. In this manner, the length of the drift region is extended without increasing the size of the MOS transistor. A more compact MOS transistor can be formed while preserving the high breakdown voltage characteristics.

The trench-isolated drain structure in the MOS transistor of the present invention is particularly useful in high voltage applications (100+ volts) where a longer drift region is needed to provide sufficient voltage drop for the drain terminal. In the conventional transistor structure, the only way to increase the drift region length is to increase the device size. The increase in transistor size is proportional to the increase in the size of the drift region. Therefore, a large transistor size is required for a longer drift region. However, when the trench-isolated drain structure is applied in the MOS transistor, the length of the drift region is increased without increasing the size of the transistor device. The total length of the drift region is controlled by the vertical components of the trench and therefore the length of the drift region can be increased by increasing the depth of the trench without increasing the size of the transistor.

Figure 2:
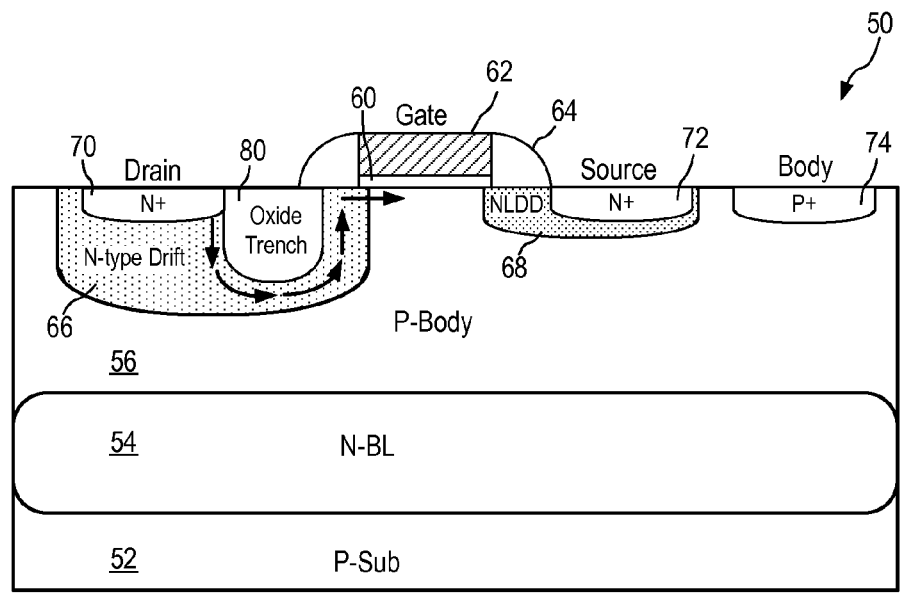
FIG. 2 is a cross-sectional view of a MOS transistor with a trench-isolated drain structure according to one embodiment of the present invention.

FIG. 2 is a cross-sectional view of a MOS transistor with a trench-isolated drain structure according to one embodiment of the present invention. Referring to FIG. 2, NMOS transistor 50 is formed on a P-type substrate 52. An N-type buried layer (N-BL) 54 separates a P-type semiconductor layer 56 from the substrate 52. Semiconductor layer 56 forms the P-type body region of NMOS transistor 50. A polysilicon gate 62 is formed on the semiconductor layer 56 and insulated from the semiconductor layer by a gate dielectric layer 60. A first N-type lightly doped region (NLDD) 68 is formed self-aligned to gate terminal 62. An N-type drift region 66 is formed also self-aligned to the gate terminal 62.

In accordance with the present embodiment of the present invention, a trench-etch process is performed to form a trench 80 in N-type drift region 66. Trench 80 is contained wholly within the drift region and is filled with an insulating material to realize an insulating trench 80. In the present embodiment, trench 80 is an oxide-filled trench filled with silicon oxide.

Sidewall spacers 64 are then formed and a first heavily doped N+ region 72 is formed in the NLDD region 68 and self-aligned to the sidewall spacer 64. The first heavily doped N+ region 72 forms the source contact diffusion region or the source terminal of the NMOS transistor. A second heavily doped N+ region 70 is formed in the N-type drift region 66 and adjacent to oxide trench 80. The second heavily doped N+ region 70 forms the drain contact diffusion region or the drain terminal of the NMOS transistor. In the present embodiment, the drain contact diffusion region 70 is formed immediately adjacent to oxide trench 80. In other embodiments, the drain contact diffusion region 70 is formed spaced apart from oxide trench 80. A third heavily doped P+ region 74 is formed in the P-type body region 56 forming the body contact diffusion region.

Figure 1:
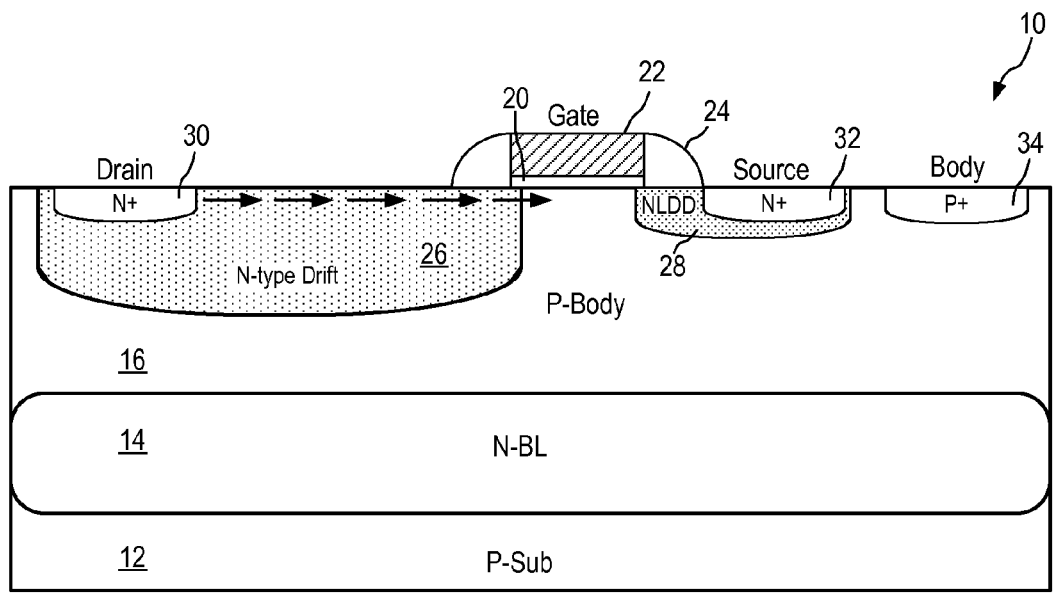
FIG. 1 is a cross-sectional view of a conventional MOS transistor.

As thus formed, NMOS transistor 50 includes a drift region 66 where the current path includes vertical and horizontal components around the shape of trench 80, as shown by the arrows in FIG. 2. The length of the drift region becomes the combination of the vertical and horizontal components the current path. The depth of trench 80 is selected to obtain the desired total drift region length for the NMOS transistor 50. Accordingly, the length of the drift region is increased without increasing the size of the transistor device. For instance, NMOS transistor 50 in FIG. 2 has the same drift region length as in the conventional NMOS transistor 10 of FIG. 1. However, the device size of transistor 50 is more compact than transistor 10.

Figure 3:
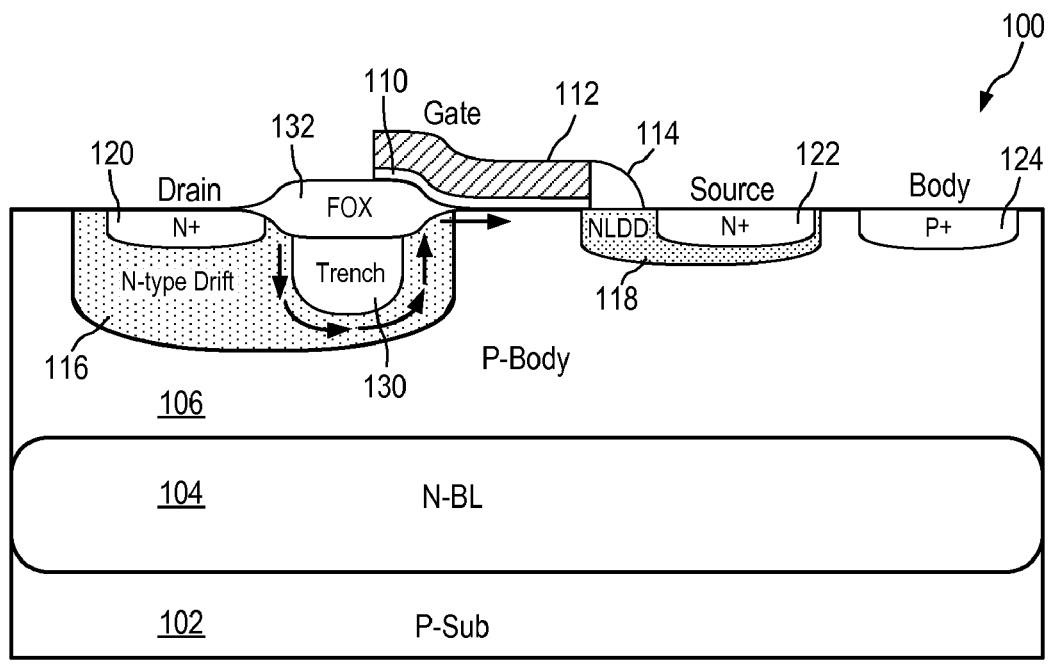
FIG. 3 is a cross-sectional view of a lateral DMOS transistor with a trench-isolated drain structure according to a second embodiment of the present invention.

FIG. 3 is a cross-sectional view of a lateral DMOS transistor with a trench-isolated drain structure according to a second embodiment of the present invention. Referring to FIG. 3, a lateral DMOS transistor 100 includes a gate 112 over a gate dielectric layer 110, a NLDD region 118 and an N+ source contact diffusion region 122 formed therein, a P-type body region 106, and a P+ body diffusion contact region 124 formed therein. The lateral DMOS transistor 100 also includes an N-type drift region 116 and an N+ drain contact diffusion region 120 formed therein (also referred to as the "drain terminal 120"). In lateral DMOS transistor 100, the drain terminal 120 is separated from the channel region of the transistor by a field oxide layer 132. In the conventional lateral DMOS transistor, the current path in the drift region would have passed horizontally under the field oxide layer 132. However, in accordance with the present invention, a trench 130 is formed in the N-type drift region 116. Trench 130 is an insulating trench and is filled with silicon oxide in one embodiment of the present invention. As thus formed, the current path in the drift region includes vertical and horizontal components around the shape of trench 130, as shown by the arrows in FIG. 3. The length of the drift region is thereby extended without increasing the size of the transistor device.

Figure 4:
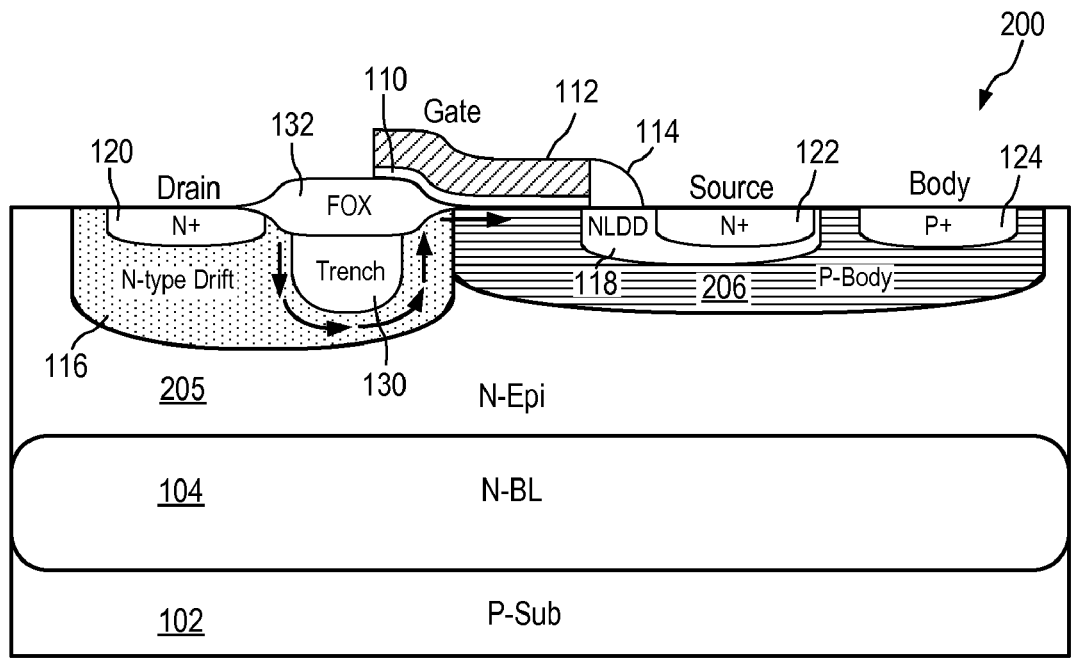
FIG. 4 is a cross-sectional view of a lateral DMOS transistor with a trench-isolated drain structure according to a third embodiment of the present invention.

FIG. 4 is a cross-sectional view of a lateral DMOS transistor with a trench-isolated drain structure according to a third embodiment of the present invention. Referring to FIG. 4, lateral DMOS transistor 200 is formed in the same manner as lateral DMOS transistor 100 of FIG. 3 except that the body region 206 is now a diffusion region formed in an N-type epitaxial layer 205.

Figure 5:
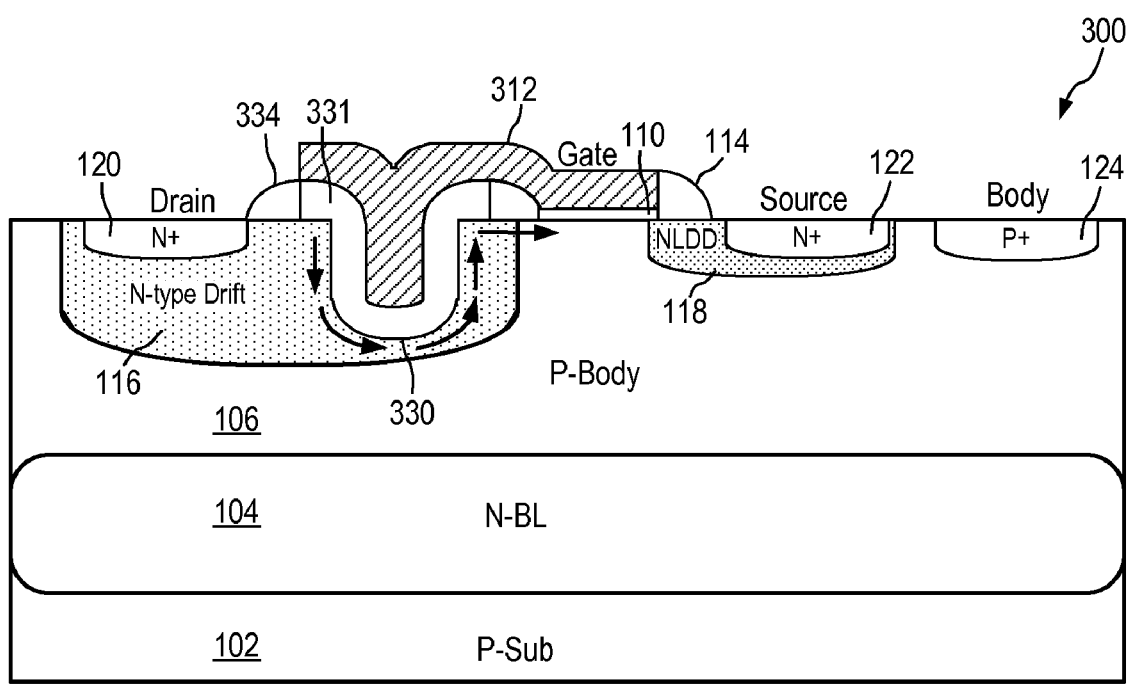
FIG. 5 is a cross-sectional view of a MOS transistor with a trench-isolated drain structure according to a fourth embodiment of the present invention.

FIG. 5 is a cross-sectional view of a MOS transistor with a trench-isolated drain structure according to a fourth embodiment of the present invention. FIG. 5 illustrates a different trench structure which can be used to form the insulating trench in the trench-isolated drain structure of the present invention. In the embodiments described above, the trench is formed filled with a dielectric material, such as silicon oxide. In the embodiment shown in FIG. 5, a trench 330 is filled with a dielectric sidewall 331 including portions protruding above the surface of the semiconductor layer. Sidewall spacers 334 are formed adjacent the dielectric sidewall 331 of trench 330 to smooth out the surface topology. Then, trench 330 is filled with a polysilicon layer which also forms the conductive gate of transistor 300. In this manner, a trench 330 is formed with oxide sidewall and is further filled with polysilicon. Trench 330 serves the same function of pushing the current path in the drift region 116 into the vertical direction to extend the length of the drift region.

The above description illustrates the application of the trench-isolated drain structure in NMOS transistors. The trench isolated drain structure of the present invention can also be applied to PMOS transistors in other embodiments.

The above detailed descriptions are provided to illustrate specific embodiments of the present invention and are not intended to be limiting. Numerous modifications and variations within the scope of the present invention are possible. The present invention is defined by the appended claims.

I claim:

1. A metal-oxide-semiconductor (MOS) transistor, comprising:
    a body region of a first conductivity type formed in a semiconductor layer;
    a conductive gate formed on a first surface of the semiconductor layer and insulated from the semiconductor layer by a gate dielectric layer;
    a source region of a second conductivity type formed in the body region of the semiconductor layer on one side of the conductive gate, a part of the source region extending underneath the conductive gate;
    a heavily doped source contact diffusion region of the second conductivity type formed in the source region, the source contact diffusion region forming the source terminal of the MOS transistor;
    a lightly doped drain region of the second conductivity type formed in the body region of the semiconductor layer on the opposite side of the conductive gate, the lightly doped drain region being a drift region of the MOS transistor and a part of the lightly doped drain region extending underneath the conductive gate;
    a heavily doped drain contact diffusion region of the second conductivity type formed in the lightly doped drain region, the drain contact diffusion region forming the drain terminal of the MOS transistor; and
    an insulating trench formed in the lightly doped drain region adjacent the drain terminal, the insulating trench blocking a surface current path in the drift region thereby forming vertical current paths in the drift region around a bottom surface of the trench,
    wherein the insulating trench comprises a dielectric sidewall and the conductive gate extends into and filling remaining portion of the trench, the dielectric sidewall having a thickness greater than the gate dielectric layer.

2. The MOS transistor of claim 1, further comprising a heavily doped body contact diffusion region of the first conductivity type formed in the body region.

3. The MOS transistor of claim 1, wherein the insulating trench is formed in the lightly doped drain region adjacent the drain terminal.

4. The MOS transistor of claim 1, wherein the insulating trench is formed in the lightly doped drain region spaced apart from the drain terminal.

5. The MOS transistor of claim 1, wherein the dielectric sidewall of the insulating trench comprises a silicon oxide layer.

6. The MOS transistor of claim 1, wherein the semiconductor layer comprises an epitaxial layer of the first conductivity type.

7. The MOS transistor of claim 1, wherein the first conductivity type is P-type and the second conductivity type is N-type.

8. The MOS transistor of claim 1, wherein the first conductivity type is N-type and the second conductivity type is P-type.

9. The MOS transistor of claim 1, wherein the dielectric sidewall of the insulating trench comprises portions protruding above the first surface of the semiconductor layer.

10. The MOS transistor of claim 1, wherein the conductive gate comprises a polysilicon layer, the polysilicon layer of the conductive gate extending over the portions of the dielectric sidewall protruding above the first surface to fill the remaining portion of the trench.

* * * * *